United States Patent [19]

Stahl et al.

[11] Patent Number: 4,720,683

[45] Date of Patent: Jan. 19, 1988

[54] CIRCUIT FOR PREVENTING RETARDING FIELD OSCILLATIONS IN ELECTRON TUBES, ESPECIALLY FOR A PULSE-WIDTH MODULATION STAGE IN TRANSMITTERS

[75] Inventors: Jochen Stahl; Ingo Beling, both of Berlin, Fed. Rep. of Germany

[73] Assignee: Siemens Aktiengesellschaft, Berlin and Munich, Fed. Rep. of Germany

[21] Appl. No.: 888,264

[22] Filed: Jul. 18, 1986

Related U.S. Application Data

[63] Continuation of Ser. No. 644,531, Aug. 27, 1984.

[30] Foreign Application Priority Data

Aug. 30, 1983 [DE] Fed. Rep. of Germany ....... 3331267

[51] Int. Cl.$^4$ .................... H03H 11/00; H03G 1/28
[52] U.S. Cl. ........................................ 328/245; 332/6
[58] Field of Search ................ 328/215, 245; 332/61; 331/84, 92; 330/42

[56] References Cited

U.S. PATENT DOCUMENTS 2,854,574  9/1958  Eckert, Jr. et al. ................. 328/215
3,158,815  11/1964  Hoice et al. ......................... 328/215

OTHER PUBLICATIONS

Publication by Rint, entitled Lexikon der Hochfrequenz-, Nachrichten- und Elecktronik, vol. 1, 1957, pp. 527 and 528.

Primary Examiner—Stanley D. Miller
Assistant Examiner—B. P. Davis
Attorney, Agent, or Firm—Herbert L. Lerner; Laurence A. Greenberg

[57] ABSTRACT

A circuit for preventing retarding field oscillations in electron switching tubes, includes a feeding diode connected to the plate of the switching tube, and a power supply for generating the retarding field voltage, the power supply being connected in parallel with the switching tube through the feeding diode.

5 Claims, 3 Drawing Figures

CIRCUIT FOR PREVENTING RETARDING FIELD OSCILLATIONS IN ELECTRON TUBES, ESPECIALLY FOR A PULSE-WIDTH MODULATION STAGE IN TRANSMITTERS

This application is a continuation of application Ser. No. 644,531 filed Aug. 27, 1984.

The invention relates to a circuit for preventing retarding field oscillations in electron tubes, especially for a pulse-width modulation stage in transmitters.

If electron tubes are operated in so-called overvolted operation, which means that the plate voltage is lower than the grid voltage, retarding field oscillations take place due to corresponding electron densities. These oscillations are also known as Barkhausen-Kurz oscillations (see, for instance, the publication by Rint, entitled Lexikon der Hochfrequenz-, Nachrichten- und Elektrotechnik, vol. 1, 1957, pages 527 and 528). The frequency of these oscillations depends on the electrode voltages applied.

Retarding field oscillations occur in triodes as well as in tetrodes.

These oscillations cannot be prevented by external damping. They can only be prevented if the plate voltage is not allowed to become so low, or the electron current so high, that the retarding field oscillations can develop.

Circuit-wise, this is possible in many applications. In so-called PDM (Pulse-Duration Modulated) transmitters, these measures would lead to a degradation of the modulator efficiency.

It is accordingly an object of the invention to provide a circuit for preventing retarding field oscillations in electron tubes, especially for a pulse-width modulated stage in transmitters, which overcomes the hereinaforementioned disadvantages of the heretofore-known devices of this general type, and to prevent the operating states which lead to starting-up the retarding field oscillations.

With the foregoing and other objects in view there is provided, in accordance with the invention, a circuit for preventing retarding field oscillations in electron switching tubes, especially for a pulse-width modulation stage in transmitters, comprising a feeding diode connected to the plate of the switching tube, and a power supply for generating the retarding field voltage, the power supply being connected in parallel with the switching tube through the feeding diode.

The circuit according to the invention prevents the voltage at the plate of the PDM switching from dropping below a given value in any operating condition, so that no retarding field oscillations occur. The amount of power that must be applied by this power supply is small, so that the plate efficiency of the switching tube is only slightly decreased. By matching the additional plate voltage source to the tube type, the effect of the circuit can be optimized. Depending on the tube type, the magnitude of the voltage $U_{Br}$ (retarding field voltage) is about 50 to 300 V. The current depends on the power rating of the pulse width modulation stage.

Other features which are considered as characteristic for the invention are set forth in the appended claims.

Although the invention is illustrated and described herein as embodied in a circuit for preventing retarding field oscillations in electron tubes, especially for a pulse-width modulation stage in transmitters, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
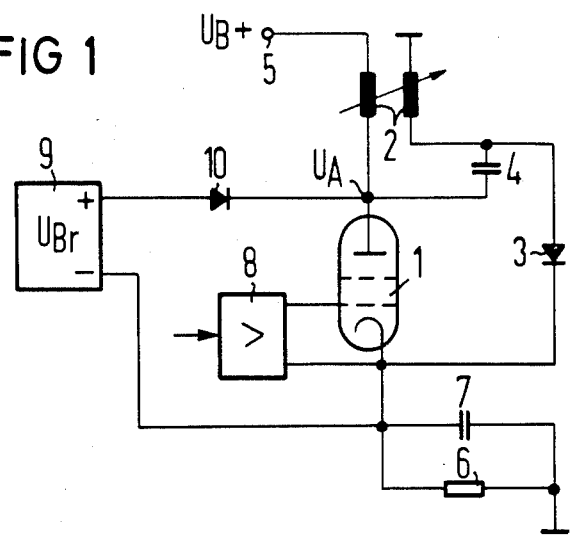
FIG. 1 is a schematic circuit diagram of the device according to the invention.

Referring now to the figures of the drawings in detail and first particularly to FIG. 1 thereof, there is seen a circuit for preventing retarding field oscillations of electron tubes, shown through the example of a pulse-width modulation stage. A power supply 9 for generating the retarding field voltage $U_{Br}$ is connected in parallel with a switching tube 1, through a feeding diode 10 for the anode of the switching tube 1. In this case, the tube 1 is a tetrode. A supply voltage 5 (battery voltage $U_B$) is applied to the plate of the switching tube 1 through a pulsed double choke 2. A coupling capacitor 4 is connected to one branch of the choke 2. A bypass diode 3 is connected parallel to the switching tube 1, between the cathode of the tube 1 and the pulsed double choke 2. A driver amplifier 8 is connected in parallel with the cathode and the control grid of the switching tube 1. A pulse-width modulated signal is fed to a load 6 (transmitter output stage), which is shunted by a filter capacitor 7.

Figure 2:
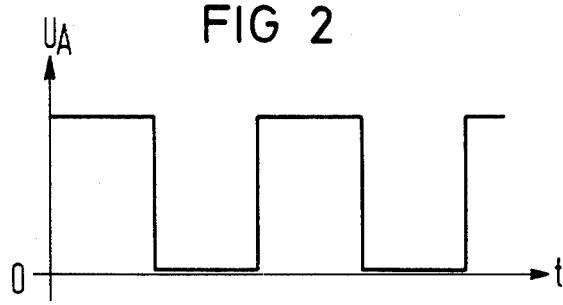
FIG. 2 is a graph of the plate voltage waveform without the power supply and feed diode for the retarding field voltage of the circuit according to FIG. 1.

FIG. 2 shows a diagram of the waveform of the plate voltage $U_A$ of the switching tube 1, for a device without the power supply 9 and the feeding diode 10 for the retarding field voltage $U_{Br}$.

Figure 3:
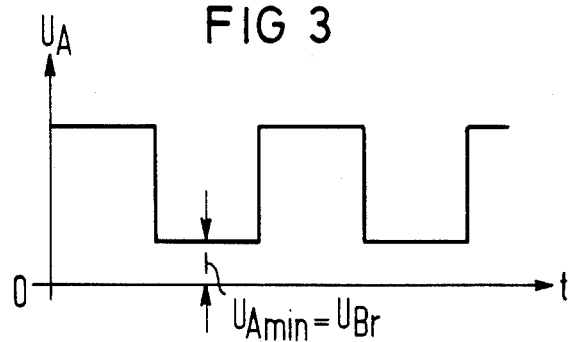
FIG. 3 is a graph regarding the plate voltage waveform of the circuit according to the invention.

FIG. 3 shows a diagram of the waveform of the plate voltage $U_A$ of the switching tube 1 according to the invention, with the power supply 9 and the feeding diode 10 for the retarding field voltage $U_{Br}$.

The minimum plate voltage $U_{Amin}$ is equal to the retarding field voltage $U_{Br}$.

The foregoing is a description corresponding in substance to German Application No. P 33 31 267.2, filed Aug. 30, 1983, the International priority of which is being claimed for the instant application, and which is hereby made part of this application. Any material differences between the foregoing specification and the aforementioned corresponding German application are to be resolved in favor of the latter.

We claim:

1. Pulse-width modulation stage of a transmitter comprising:
   a tetrode electron switching tube including a plate, connected to a positive supply voltage, at least one control grid, a suppressor grid, and a cathode;
   a load connected between said cathode and a reference potential;
   a drive amplifier connected between said cathode and said control grid for driving said switching tube; and
   a power supply for suppressing retarding field oscillations, generating a retarding field voltage connected at its positive terminal to said plate via a forward biased feeding diode and at its negative terminal to a connection point between said cathode and said load.

2. Circuit for prevention of retarding field oscillations comprising:

an electron switching tube of the tetrode type having a plate and a cathode operating as a pulse-width modulation stage in a transmitter; a power supply connected in parallel with the tube having a positive and a negative terminal for supplying a positive voltage for suppressing retarding field oscillations; and a diode, having an anode and a cathode, connected with its cathode to the plate and with its anode to the power supply's positive terminal.

3. Circuit according to claim 2 wherein the power supply's negative terminal is connected to the cathode of the tube.

4. Circuit according to claim 2 including a drive amplifier for driving the modulation stage.

5. Circuit according to claim 3 including a drive amplifier for driving the modulation stage.

* * * * *